(12) United States Patent
Chen et al.

(10) Patent No.: US 10,816,741 B2
(45) Date of Patent: Oct. 27, 2020

(54) FIBER OPTICS PRINTED CIRCUIT BOARD ASSEMBLY SURFACE CLEANING AND ROUGHENING

(71) Applicant: FINISAR CORPORATION, Sunnyvale, CA (US)

(72) Inventors: Tao Chen, Sunnyvale, CA (US); Cheng Jie Dong, Sunnyvale, CA (US); Jin Jiang, Sunnyvale, CA (US); Ting Shi, Sunnyvale, CA (US); Shao Jun Yu, Sunnyvale, CA (US); You Ji Liu, Sunnyvale, CA (US)

(73) Assignee: II-VI Delaware Inc., Wilmington, DE (US)

( * ) Notice: Subject to any disclaimer, the term of this patent is extended or adjusted under 35 U.S.C. 154(b) by 10 days.

(21) Appl. No.: 16/007,855

(22) Filed: Jun. 13, 2018

(65) Prior Publication Data
US 2019/0377141 A1 Dec. 12, 2019

(30) Foreign Application Priority Data
Jun. 6, 2018 (CN) ............................ 2018 1 0575121

(51) Int. Cl.
*G02B 6/42* (2006.01)
*H05K 3/00* (2006.01)
*H05K 3/34* (2006.01)
*H05K 3/30* (2006.01)

(52) U.S. Cl.
CPC ............ *G02B 6/428* (2013.01); *G02B 6/4206* (2013.01); *H05K 3/0026* (2013.01); *H05K 3/305* (2013.01); *H05K 3/3452* (2013.01)

(58) Field of Classification Search
CPC ........ G02B 6/428; G02B 6/4206; H05K 3/305; H05K 3/3452; H05K 3/0026; H05K 2201/10121
See application file for complete search history.

(56) References Cited

U.S. PATENT DOCUMENTS

| | | | | |
|---|---|---|---|---|
| 6,320,127 | B1 * | 11/2001 | Nagarajan | H01L 21/563 174/557 |
| 6,670,222 | B1 * | 12/2003 | Brodsky | H01L 21/4803 257/E21.505 |
| 2002/0028867 | A1 * | 3/2002 | Cottis | C08K 3/22 524/423 |
| 2002/0102745 | A1 * | 8/2002 | Lahiri | H01L 21/485 438/4 |
| 2006/0006404 | A1 * | 1/2006 | Ibbetson | H01L 23/481 257/99 |
| 2019/0148321 | A1 * | 5/2019 | Chaji | H01L 24/27 438/57 |

* cited by examiner

*Primary Examiner* — Stephen W Smoot
*Assistant Examiner* — Vicki B. Booker
(74) *Attorney, Agent, or Firm* — Maschoff Brennan

(57) ABSTRACT

The present disclosure generally relates to printed circuit boards or printed circuit board assemblies for fiber optic communications. In one example, a method may include coupling at least one optoelectronic component to a surface of a printed circuit board. The method may include lasering the surface of the printed circuit board to form a laser-roughened area on the surface of the printed circuit board. The method may include coupling an optical component to the printed circuit board at the laser-roughened area on the surface of the printed circuit board.

15 Claims, 9 Drawing Sheets

FIBER OPTICS PRINTED CIRCUIT BOARD ASSEMBLY SURFACE CLEANING AND ROUGHENING

CROSS-REFERENCE TO RELATED APPLICATIONS

This application claims priority to Chinese Patent Application No. 201810575121.7, filed Jun. 6, 2018, titled FIBER OPTICS PRINTED CIRCUIT BOARD ASSEMBLY SURFACE CLEANING AND ROUGHENING, and which is incorporated herein by reference in its entirety.

BACKGROUND

The present disclosure generally relates to printed circuit boards or printed circuit board assemblies for fiber optic communications. In particular, the present disclosure relates to modifications to a surface of printed circuit boards to facilitate manufacture of optoelectronic assemblies, which may result in improved optoelectronic assemblies that incorporate aspects described herein.

Printed circuit boards (PCBs) mechanically support and electrically connect electrical components using conductive couplings such as traces, tracks, pads and/or other features etched from one or more layers of electrically conductive material, such as copper, attached to one or more layers of a non-conductive substrate. Components are generally soldered onto the PCB to both electrically connect and mechanically fasten them to it. PCBs may be used in optoelectronic assemblies that convert electrical signals to optical signals, optical signals to electrical signals, or both. Optoelectronic assemblies may be used, for example, in fiber optic communication to exchange data at increased rates.

In optoelectronic assemblies that implement PCBs, both electrical and optical components may be coupled to the PCB. However, PCB assemblies with both electrical and optical components may pose various manufacturing challenges that may need to be addressed to effectively produce optoelectronic assemblies.

The claimed subject matter is not limited to embodiments that solve any disadvantages or that operate only in environments such as those described above. This background is only provided to illustrate examples of where the present disclosure may be utilized.

SUMMARY

The present disclosure generally relates to modifications to a surface of a printed circuit board (PCB) to facilitate manufacture of optoelectronic assemblies, which may result in improved optoelectronic assemblies that incorporate aspects described herein.

In one non-limiting example, a method may include coupling at least one optoelectronic component to a surface of a PCB. The method may include lasering the surface of the PCB to form a laser-roughened area on the surface of the PCB. The method may include coupling an optical component to the PCB at the laser-roughened area on the surface of the PCB.

The optical component may be attached at a coupling area on the surface of the PCB, and the laser-roughened area may be positioned at least partially or fully inside of the coupling area. The optical component may be coupled to the PCB using an adhesive, such as epoxy or another suitable adhesive. The optical component may be optically coupled or optically aligned with the optoelectronic component.

The lasering may remove at least a portion of a layer of the PCB. The lasering may increase the roughness of the surface of the PCB. In some aspects, the lasering may increase the arithmetical mean deviation of the assessed profile of the surface of the PCB by at least 0.1. The lasering may remove or decompose contaminants on the surface of the PCB. The lasering may improve the coupling of the optical component to the PCB by increasing the roughness of the roughness of the surface of the printed circuit board and/or removing contaminants from the surface of the printed circuit board.

In some aspects, the method may include applying a solder mask to the surface of the printed circuit board before the laser is applied. The lasering may remove at least a portion of a layer of the PCB and/or at least a portion of the solder mask on the PCB.

The optical component may be a lens optically coupled or optically aligned to the optoelectronic component. The laser-roughened area may at least partially surround the optoelectronic component in a plane defined by the PCB. The optical component may at least partially enclose the optoelectronic component after the optical component is coupled to the PCB. The optoelectronic component may be hermetically sealed between the PCB and the optical component after the optical component is coupled to the PCB.

The method may include attaching at least one electrical component to the surface of the printed circuit board. The laser may be applied for a sufficient time and duration to decompose a surface of the PCB such that the laser-roughened area is visually perceptible. The method may include visually inspecting the surface of the printed circuit board to determine whether a portion of the printed circuit board has been lasered.

In another non-limiting example, an optoelectronic assembly may include a printed circuit board, at least one optoelectronic component coupled to a surface of the printed circuit board, and an optical component attached to a laser-roughened area of the surface of the printed circuit board. The optical component may be attached to a laser-roughened area with an adhesive. The optical component may be optically coupled or optically aligned with the optoelectronic component. The optical component may be a lens or another optical component that at least partially encloses the optoelectronic component.

The laser-roughened area of the surface of the printed circuit board may be rougher than a remaining area of the surface of the printed circuit board. The laser-roughened area of the surface of the printed circuit board may have a larger arithmetical mean deviation of the assessed profile than the remaining area of the surface of the printed circuit board. The difference between the laser-roughened area and the remaining area of the surface of the printed circuit board may be visually perceptible.

The optoelectronic assembly may include a solder mask on the surface of the printed circuit board. The solder mask may be absent at the laser-roughened area of the surface of the printed circuit board. The laser-roughened area may surround the optoelectronic component in a plane defined by the printed circuit board. The optical component may be a lens that at least partially encloses the optoelectronic component. The lens may be optically aligned with the optoelectronic component. The lens may hermetically seal the optoelectronic component.

This Summary introduces a selection of concepts in a simplified form that are further described below in the Detailed Description. This Summary does not identify key features or essential characteristics of the claimed subject matter, and should not be used as an aid in determining the scope of the claimed subject matter.

DETAILED DESCRIPTION

Figure 1A:
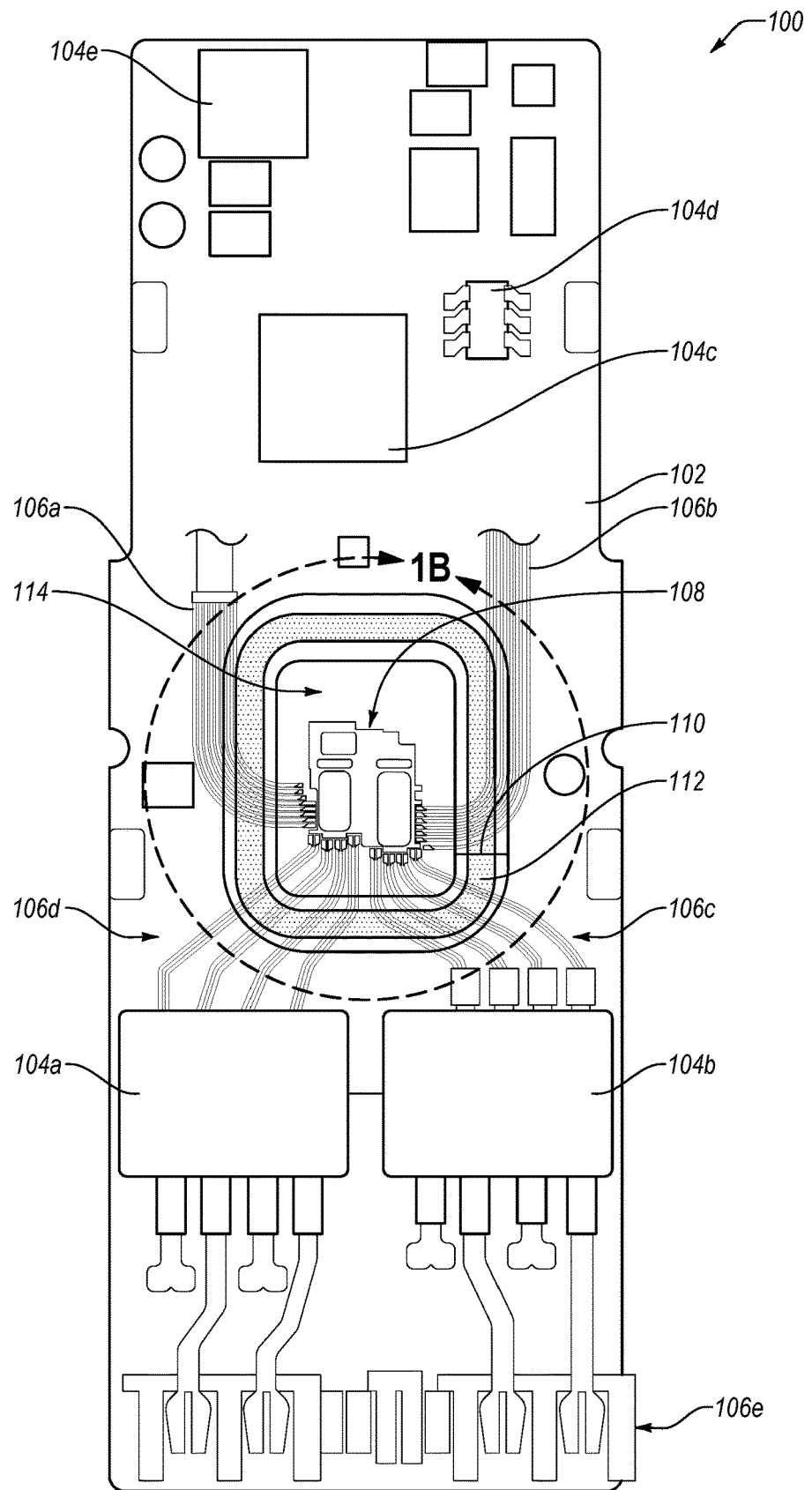
FIG. 1A is a top schematic view of an example printed circuit board assembly (PCBA)

The present disclosure generally relates to printed circuit boards or printed circuit board assemblies for fiber optic communications. Assemblies that incorporate printed circuit boards (PCBs) may be referred to as printed circuit board assemblies (PCBAs). In particular, the present disclosure relates to modifications to the surface of PCB to facilitate manufacture of optoelectronic assemblies, which may result in improved optoelectronic assemblies that incorporate aspects described herein.

PCBs may be implemented in optoelectronic assemblies configured for fiber optic communication. Optoelectronic assemblies that implement PCBs may include both electrical and optical components that are coupled to the PCB. However, PCB assemblies with the electrical and optical components may pose various manufacturing challenges that interfere with effective and efficient production of optoelectronic assemblies.

For example, certain optical components such as lenses, may be optically aligned with other optical components. Therefore the optical components may need to be more precisely positioned and attached to the PCB than electrical components. Furthermore, it may not be practicable to attach optical components to the PCB with solder. Therefore, optical components may be attached to the PCB in other manners. However, additional challenges arise in coupling optical components to the PCBs in a cost-effective and robust manner.

In some circumstances, it may desirable to mechanically couple optical components to the surface of a PCB, for example, using an adhesive or other suitable attachment process. For instance, in some conventional processes to mechanically couple the optical components to the surface, the PCB may be untreated. The untreated PCB includes a substantially smooth surface that is not cleaned. If the surface of the PCB is contaminated, the optical component may not sufficiently bond to the PCB. Furthermore, if the surface of the PCB is contaminated when the optical component is bonded to the PCB, the resulting bond between the PCB and the optical component may be relatively weak. In such circumstances, the bond may break over time, for example, during subsequent processing of the PCB to form the optoelectronic assembly. Additionally, the weak bond may break after the optoelectronic assembly is manufactured, for example, during operation of the optoelectronic assembly. Furthermore, in such circumstances the optoelectronic assembly may fail prematurely because of a weak bond caused by the substantially smooth surface of the PCB or the contaminants on the surface of the PCB left during manufacturing.

Some PCBAs implement through-hole technology (THT). THT refers to a mounting process for attaching electrical components using leads that extend from the electrical components. The leads are inserted into holes formed in the PCB and soldered to pads on the opposite side of the PCB. Other PCBAs implement surface-mount technology (SMT). SMT is a mounting process in which components are mounted or placed directly onto the surface of the PCBs. SMT components are usually smaller than THT components because they have either smaller leads or no leads at all. Generally, SMT speeds up the manufacturing process when compared to THT. However, use of SMT in some circumstances increase the risk of defects due to component miniaturization and denser packing of components on the PCB. In such circumstances, detecting defects (e.g., contaminants or defective bonds) may also be more difficult. Although both SMT and THT may be implemented in various circumstances, SMT has largely replaced THT in manufacture of PCBAs.

The surface of the PCB may be contaminated during the normal course of manufacturing, for example, during SMT or THT processes. Contaminants such as flux, oil, dust, adhesive, or other contaminants may be deposited on the surface of the PCBs as the PCBs are being formed. Such contaminants may be difficult to detect, during and after manufacturing, and may lead to the weak bonds that are also difficult to detect. For instance, the contaminants may be invisible to the human eye, using a microscope, or using other detection methods. Thus, it may be difficult to determine whether a surface of a PCB is contaminated before bonding. Furthermore, it may be difficult to remove contaminants that are not visible or detectable, and to determine whether or not the contaminants were successfully removed.

Even if the surface of the PCBs does not include contaminants, in some circumstances the PCB may not be well-suited for attaching components to its surface. For example, the surface of the PCB may be relatively smooth. Adhesives may not bond as well to smooth surfaces as to rough surfaces. Some PCBs may include a solder mask, which is a thin lacquer-like layer of polymer that is applied to the surface of the PCB. The solder mask may be used to protect electrically conductive traces on the PCB from oxidation and to prevent or reduce undesired electrical connections between adjacent conductive traces that are positioned relatively close to one another. The solder mask may also be relatively smooth, and adhesives may form relatively poor bonds with the solder mask, for example, when coupling optical components to the PCB.

Accordingly, the present disclosure includes configurations to modify the surface of PCBs to remove contaminants (e.g., clean the surface) and/or increase the roughness of the surface. In particular, a laser may be used to remove contaminants on the surface of the PCB. Furthermore, the laser may be used to remove a portion of the PCB (e.g., a portion of a layer of the PCB, an entire layer of the PCB, or more than one layer of the PCB). Additionally, the laser may be used to increase the roughness of the surface of the PCB.

Aspects described herein may improve bonding between the PCB and components attached to the PCB (e.g., optical components or others) using, for example, adhesives or other suitable attachment processes. Specifically, bonding between the PCB and a component may be improved because the laser removes contaminants from the surface of the PCB and/or increases its roughness. This may improve the strength of the bonds between the PCB and optical components, which in turn may decrease the likelihood that the bonds will break during and after manufacturing. Furthermore, assemblies implementing the concepts described herein may be less likely to fail prematurely as result of broken bonds between the PCB and attached components.

In addition, the laser may visibly modify the surface of the PCB, making it easier to determine whether contaminants have been removed from a certain area on the PCB and/or whether the area has been roughened. For example, the laser may change a color and/or a texture of the surface of the PCB where the laser is applied. In particular, the color and/or the texture of the surface may be different in an area because all or a portion of a layer of the PCB may be removed by the laser. Such configurations may also facilitate positioning of components to be coupled to the PCB, because the visibly modified surface may indicate where the component should be attached to the PCB.

Using a laser to modify the surface of the PCB may avoid damaging components coupled to the PCB. In particular, some components (e.g., electrical components or others) may be attached to the PCB before the laser is applied to the surface of the PCB. The laser may be accurately controlled to apply the laser in specific areas on the surface of the PCB. Accurate control of the laser may avoid the components that are already coupled to the PCB so these components are not damaged. Use of the laser may provide some advantages relative to other contamination-removal processes. For instance, other processes for removing contaminants from the PCB such as solvent cleaning, plasma cleaning, etc. may risk damaging components on the PCB.

Reference will be made to the drawings and specific language will be used to describe various aspects of the disclosure. Using the drawings and description in this manner should not be construed as limiting its scope. Additional aspects may be apparent in light of the disclosure, including the claims, or may be learned by practice.

FIG. 1A is a top schematic view of an example of a PCBA 100. The PCBA 100 may include a PCB that includes an insulating substrate 102 and a surface 118. Various components, such as electrical components 104*a-e*, may be positioned on and mechanically coupled to the substrate 102. The electrical components 104*a-e* may be electrically coupled by conductive couplings 106*a-e*. The conductive couplings 106*a-e* may be traces, tracks, pads and/or other features etched from one or more layers of electrically conductive material, such as copper. The electrical components 104*a-e* may be soldered to electrically and mechanically couple them to the PCBA 100.

The PCBA 100 may include a single layer or multilayer configuration. If the PCBA 100 is a single layer PCB, then it may include one layer of the insulating substrate with conductive couplings positioned on one or both sides. If the PCBA 100 is a multilayer PCB, then it may include multiple layers of insulating substrate, and conductive couplings may be positioned on and/or in between the multiple layers.

In some configurations, the PCBA 100 may include a solder mask, which is a layer applied to the surface 118 of the PCBA 100. The solder mask may be a layer on the surface 118 or proximate the surface 118 of the PCBA 100. The solder mask may protect portions of the PCBA 100, such as the conductive couplings 106*a-e*. For example, the solder mask may protect the conductive couplings 106*a-e* from oxidation and to prevent undesired electrical connections between adjacent conductive couplings (e.g., 106*a* and 106*d*) that are positioned relatively close to one another. The solder mask may be relatively smooth, and adhesives may form relatively poor bonds with the solder mask, for example, when components are attached to the PCBA 100.

In some circumstances, the solder mask may be applied to the PCBA 100 using a mask or silk screening technique. The solder mask may be applied as an epoxy liquid through a silkscreen pattern onto the PCBA 100. Additionally or alternatively, the solder mask may be applied using any suitable technique, such as liquid photoimageable solder mask (LPSM) or dry film photoimageable solder mask (DFSM). Once applied, the solder mask may be cured, for example, using a thermal or ultra violet curing process. Openings may be formed in the solder mask using any suitable process, such as photolithography.

The PCBA 100 may include optoelectronic components 108. In such configurations, the PCBA 100 may be included in an optoelectronic assembly used for fiber optic communication, although the concepts described herein may be implemented in any suitable PCBA. The optoelectronic components 108 may include components related to the conversion of electrical signals to optical signals, optical signals to electrical signals, or both. For example, the optoelectronic components 108 may include a receiver or receiver array configured to receive optical signals and to generate corresponding electrical signals. In another example, the optoelectronic components 108 may include a transmitter or transmitter array configured to receive electrical signals and to generate corresponding optical signals.

The optoelectronic components 108 may include or may be coupled to components related to optical transmitters and receivers. Some examples of the components may include amplifiers (e.g., transimpedance amplifiers, limiting amplifiers, or others), clock and data recovery (CDR) circuits, digital signal processing circuits, drivers, digital-to-analog converter (DAC) circuits, modulators, or other suitable components. In some configurations, such components may be included in the electrical components 104*a-e*.

As explained above, the optoelectronic assembly may include electrical components 104*a-e* and/or optoelectronic components 108 coupled to the PCBA 100. The optoelectronic assembly may also include optical components optically coupled or optically aligned to the optoelectronic components 108. The optical components may include lenses, filters, collimators, mirrors, polarizers, or any other suitable component used in optoelectronics. The optical components may be configured to perform an optical function such as direct, focus, collimate, modulate, multiplex, or demultiplex optical signals travelling to or from the optoelectronic components 108.

At least some of the optical components may be mechanically coupled to the PCBA 100. As illustrated, an optical component may be mechanically coupled to the PCBA 100 at coupling area 110. The coupling area 110 may correspond to the size and/or shape of an optical component to be coupled with the PCBA 100. In the illustrated configuration, the coupling area 110 is rectangular and annular (e.g., a rectangular annulus) with rounded corners. The coupling area 110 may correspond to a rectangular optical component that is to be mechanically coupled to the PCBA 100 and optically coupled to the optoelectronic components 108. In other configurations, the coupling area 110 may be any suitable shape or size, and the configuration of the coupling area 110 may depend on the shape and size of the optical component. In the illustrated example, the optical component may include a lens, although any suitable component may be coupled to the PCBA 100 according to the concepts described in this disclosure.

The PCBA 100 may include a laser-roughened area 112. The laser-roughened area 112 may correspond to the size and/or shape of the coupling area 110 or the optical component to be coupled with the PCBA 100. In the illustrated configuration, the laser-roughened area 112 is rectangular and annular (e.g., a rectangular annulus) with rounded corners, corresponding to the coupling area 110. The laser-roughened area 112 may be positioned entirely within the coupling area 110 as shown, although other configurations may be implemented. In other configurations, the laser-roughened area 112 may be any suitable shape or size, and the configuration of the laser-roughened area 112 may depend on the shape and size of the coupling area 110, the optical component, or both.

The laser-roughened area 112 may be formed by a laser applied to the surface 118 of the PCBA 100 (e.g., lasering the surface 118 of the PCBA 100), as described in further detail below. The laser may be used to remove a portion of the PCBA 100 to form the laser-roughened area 112. In particular, the laser may be used to remove a portion of a layer of the PCBA 100, an entire layer of the PCBA 100, or more than one layer of the PCBA 100. For example, the laser may be used to remove between about 1 and 30 micrometers (μm) of the PCBA 100 (e.g., depth or height of the removed portion). In some configurations, the power, intensity and/or wavelength of the laser may be selected to remove a desired amount of the PCBA 100. Additionally or alternatively, the laser may be applied repeatedly a given area to remove additional layers or portions of the PCBA 100. Accordingly, additional portions may be removed each time the laser is applied to an area on the PCBA 100. (e.g., the laser-roughened area 112).

The power, intensity and/or wavelength of the laser used to form the laser-roughened area 112 may be selected to be sufficiently high to increase the roughness of the surface. Additionally or alternatively, the power, intensity and/or wavelength of the laser used to form the laser-roughened area 112 may be selected to be sufficiently high to remove or decompose contaminants without damaging the PCBA 100 and/or the components coupled to the PCBA 100, such as the electrical components 104a-e and the optoelectronic components 108. The desired power, intensity and/or wavelength of the laser may depend on materials included in the PCB (e.g., layers of the PCB), materials of the contaminants, materials of components coupled to the PCB, or any suitable combination thereof. In one example, the laser may be an ultraviolet laser, for example, a laser emitting electromagnetic radiation within a range of ultraviolet wavelengths. In some circumstances, ultraviolet wavelengths may include wavelengths between 100 nanometers (nm) and 400 nm. In some configurations, the laser may be a 355 nm wavelength laser, although other suitable configurations may be implemented. Additionally or alternatively, in some configurations the laser may include a laser power of 3 Watts (W).

The laser-roughened area 112 of the surface 118 of the PCBA 100 may be rougher than a remaining area of the surface 118 of the PCB. The laser-roughened area 112 of the surface 118 of the PCB may have a larger arithmetical mean deviation of the assessed profile than the remaining area of the surface 118 of the PCB. The difference between the laser-roughened area 112 and the remaining area of the surface 118 of the PCB may be visually perceptible. Accordingly, it may be possible to visually determine whether or not portions of the surface 118 has been roughened and/or whether contaminants have been removed in certain areas on the surface 118.

Figure 1B:
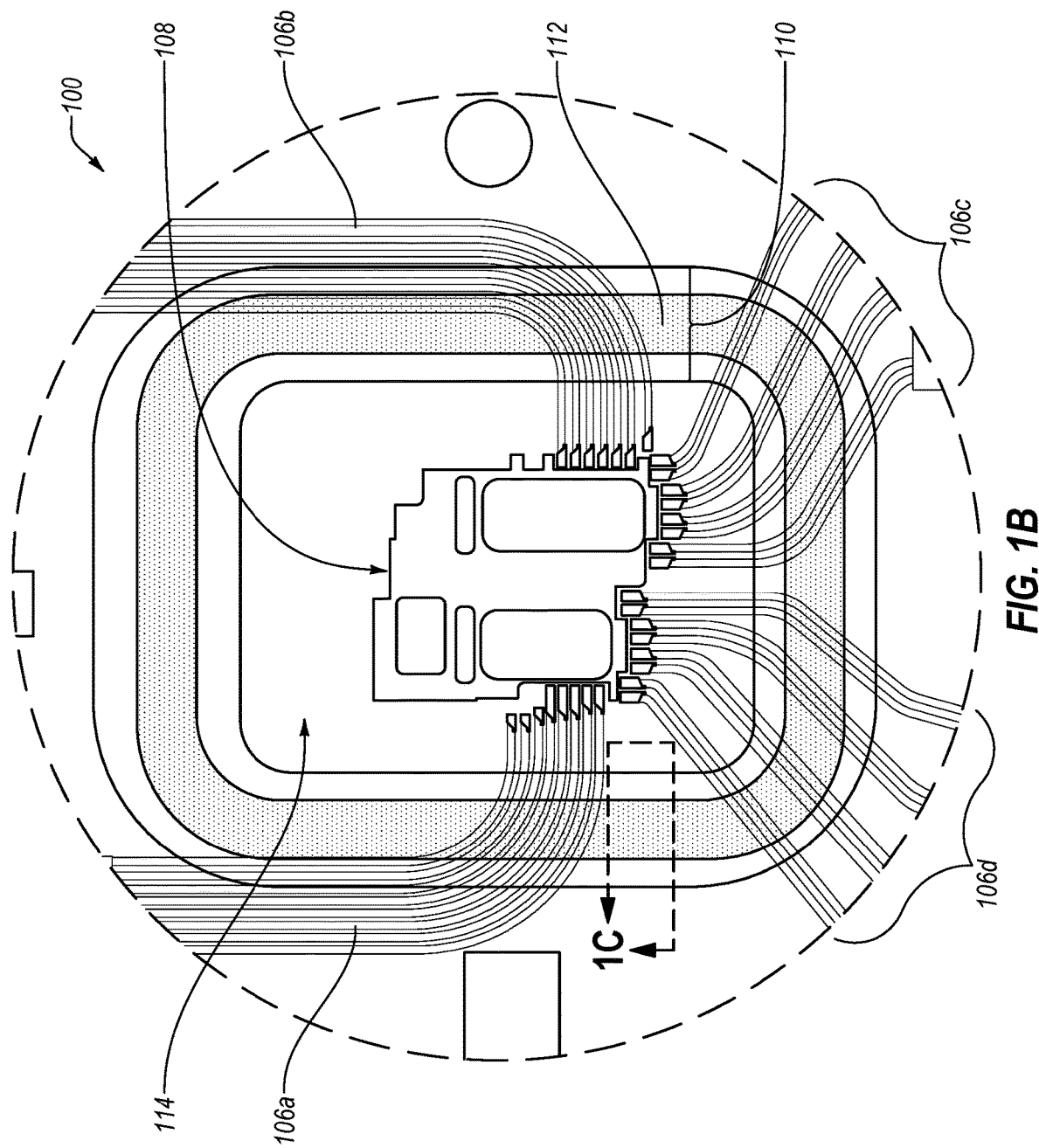
FIG. 1B is a top schematic view of a portion of the PCBA of FIG. 1A.

FIG. 1B is a top schematic view of a portion of the PCBA 100 of FIG. 1A. In particular, FIG. 1B illustrates a portion of the PCBA 100, denoted by circle 1B in FIG. 1A. In FIG. 1B, the optoelectronic components 108, the coupling area 110, and the laser-roughened area 112 are shown in further detail. As introduced above, the laser-roughened area 112 may be positioned entirely within the coupling area 110. In the illustrated configuration, the laser-roughened area 112 is concentrically positioned within the coupling area 110, although other configurations may be implemented. The optoelectronic components 108 may be electrically coupled to other components of the PCBA 100 with conductive couplings 106a-d.

As mentioned, the optical component may include a lens. In some configurations, the optical component may partially or wholly enclose the components positioned in an area 114 inside of the coupling area 110. For example, the optical component may define a cavity to enclose the optoelectronic components 108 between the optical component and the PCB of the PCBA 100. In such configurations, the optical component may hermetically seal the optoelectronic components 108 or other components positioned in the area 114. The laser-roughened area 112 and/or the coupling area 110 may surround the optoelectronic components 108 in a plane defined by the PCB of the PCBA 100. In addition, the optical component may be optically aligned with the optoelectronic component.

In some configurations, the PCBA 100 of FIGS. 1A-1B way be implemented in optoelectronic assemblies that implement PCBAs. For example, the PCBA 100 may be implemented in optoelectronic modules for use in transceivers, transmitter optical subassemblies (TOSAs), receiver optical subassemblies (ROSAs), active optical cables, and others. In some configurations, the optoelectronic modules may comply with the Gen4 QSFP or Gen4 QSFP+ form factor.

Figure 1C:
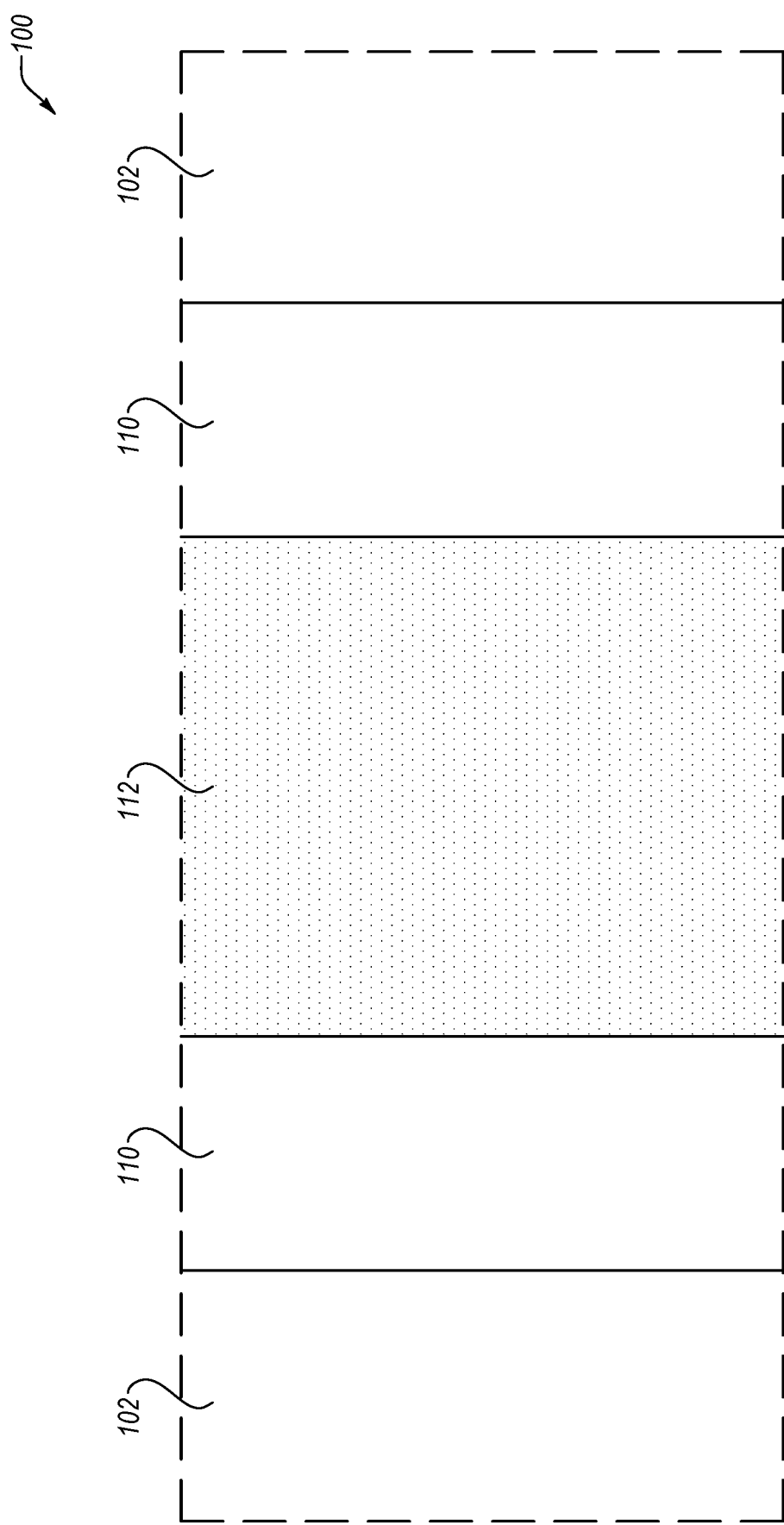
FIG. 1C is another top schematic view of a portion of the PCBA of FIG. 1A.

FIG. 1C is a top schematic view of a portion of the PCBA 100. In particular, FIG. 1C illustrates a portion of the PCBA 100, denoted by rectangle 1C in FIG. 1B. In FIG. 1B, the coupling area 110 and the laser-roughened area 112 are shown in further detail. As shown, the laser-roughened area 112 may overlap or be positioned over the coupling area 110. In the configuration shown, the laser-roughened area 112 may be smaller than the coupling area 110. In some configurations, the laser-roughened area 112 may be between about 50% and about 75% of the size of the coupling area 110, although other configurations may be implemented. In other configurations, the laser-roughened area 112 may be substantially the same size or larger than the coupling area 110. Furthermore, the laser-roughened area 112 may not be positioned fully within the coupling area 110. In such configurations, the laser-roughened area 112 may partially overlap the coupling area 110.

Figure 2A:
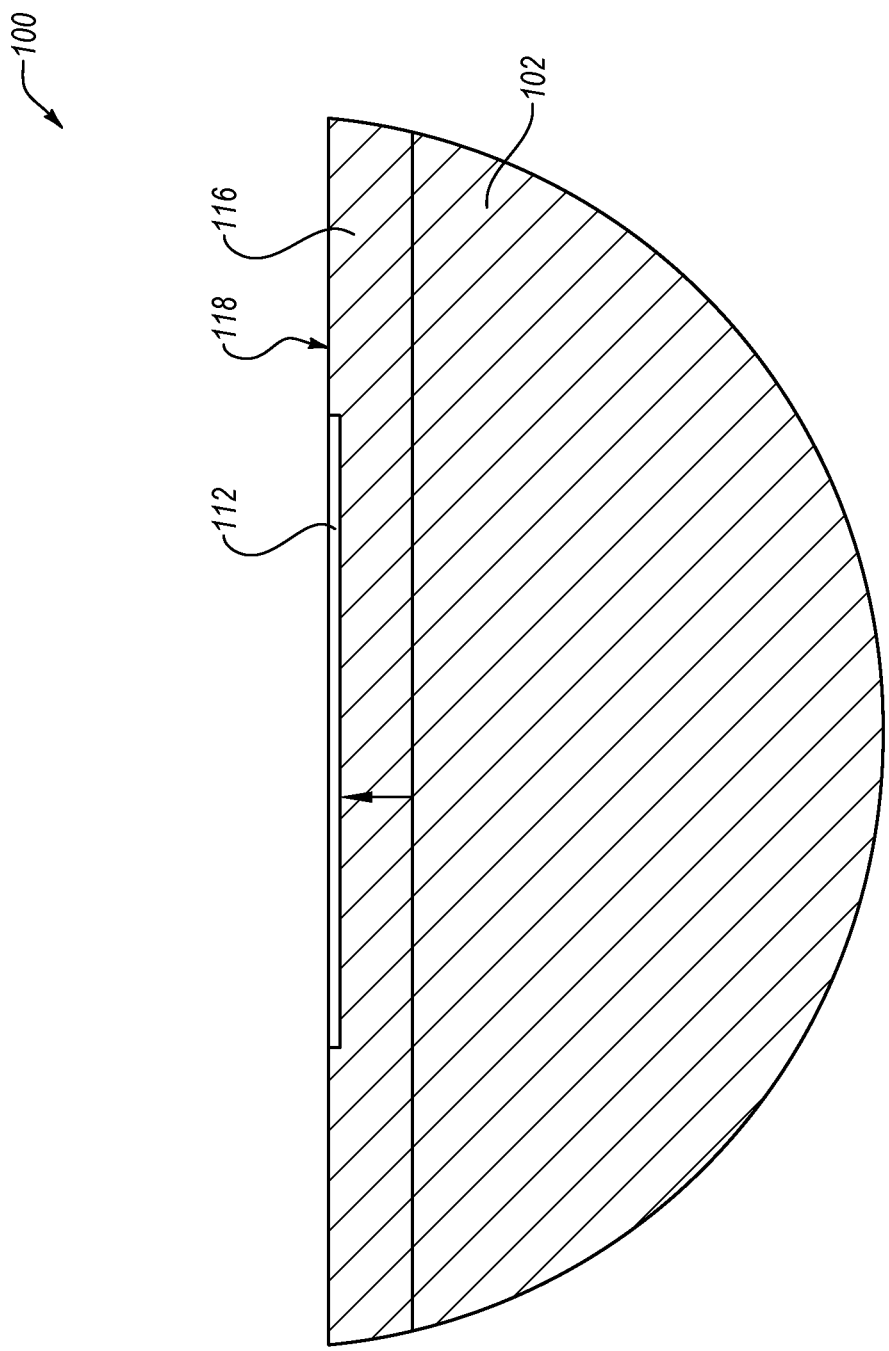
FIG. 2A is cross-sectional schematic view of a portion of the PCBA of FIG. 1A.

FIG. 2A is a cross-sectional schematic view of a portion of the PCB of the PCBA 100. In FIG. 2A, the laser-roughened area 112 is shown in further detail. As mentioned above, a laser may be used to increase the roughness of the surface 118 of the PCBA 100 and/or remove a portion of the PCBA 100. As shown in FIG. 2A, the PCBA 100 may include a layer 116 positioned over the substrate 102 and defining the surface 118 of the PCBA 100. The laser may be applied to the surface 118 to remove a portion of the layer 116 to form the laser-roughened area 112. In the illustrated configuration, only a portion of the layer 116 is removed to form the laser-roughened area 112. However, in other configurations the entire layer 116 may be removed to form the laser-roughened area 112, or additional layers (not shown) may be removed from the PCBA 100. In some configurations, the layer 116 may be a solder mask layer, or a portion of the solder mask. Accordingly, the solder mask may be the portion of the PCBA 100 that is cleaned and/or roughened. The solder mask may be absent at the laser-roughened area 112 of the PCB or the PCBA 100.

Figure 2B:
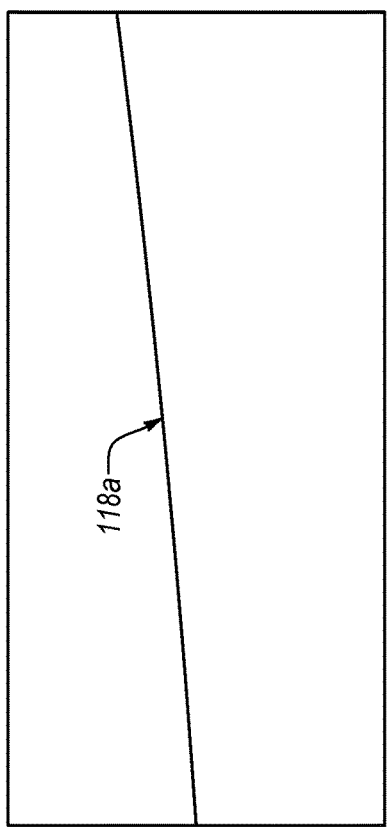
FIG. 2B is cross-sectional schematic view of a portion of the PCBA of FIG. 1A.

FIG. 2B is a cross-sectional schematic view of a portion of the PCBA 100. In particular, FIG. 2B illustrates the surface 118 of the PCBA 100 before the laser is applied, denoted at 118a, and after the laser is applied, denoted at 118b. As shown, the surface 118a before the laser is applied is relatively smooth. In such circumstances, adhesives used to bond, for example, optical components to the surface 118a may not bond well, which may result in relatively weak bonds that may prematurely fail. In contrast, the surface 118b after the laser is applied is rougher, as shown. In such circumstances, adhesives used to bond optical components (as described with reference to FIGS. 1A-1C) to the surface 118b may form stronger bonds between the optical components and the PCBs relative to the smooth surface 118A. Although any suitable adhesive may be used for bonding, in some configurations an epoxy may be implemented.

One measure of surface roughness is the arithmetical mean deviation of the assessed profile or the mean roughness of the profile of the surface, denoted as $R_a$. In one example, the $R_a$ roughness of surface 118a may be less than 0.2 μm and the $R_a$ roughness of surface 118b may be greater than 0.3 μm. Accordingly, the laser may increase the roughness of the surface 118 by at least an $R_a$ of 0.1 μm. However, in other circumstances, the surfaces 118a, 118b may have other roughness values. For example, the surface 118 of the PCBA 100 may have any suitable roughness values. Furthermore, the laser may be used to increase the roughness of the surface 118 less than or greater than the example values described above.

Figure 3:
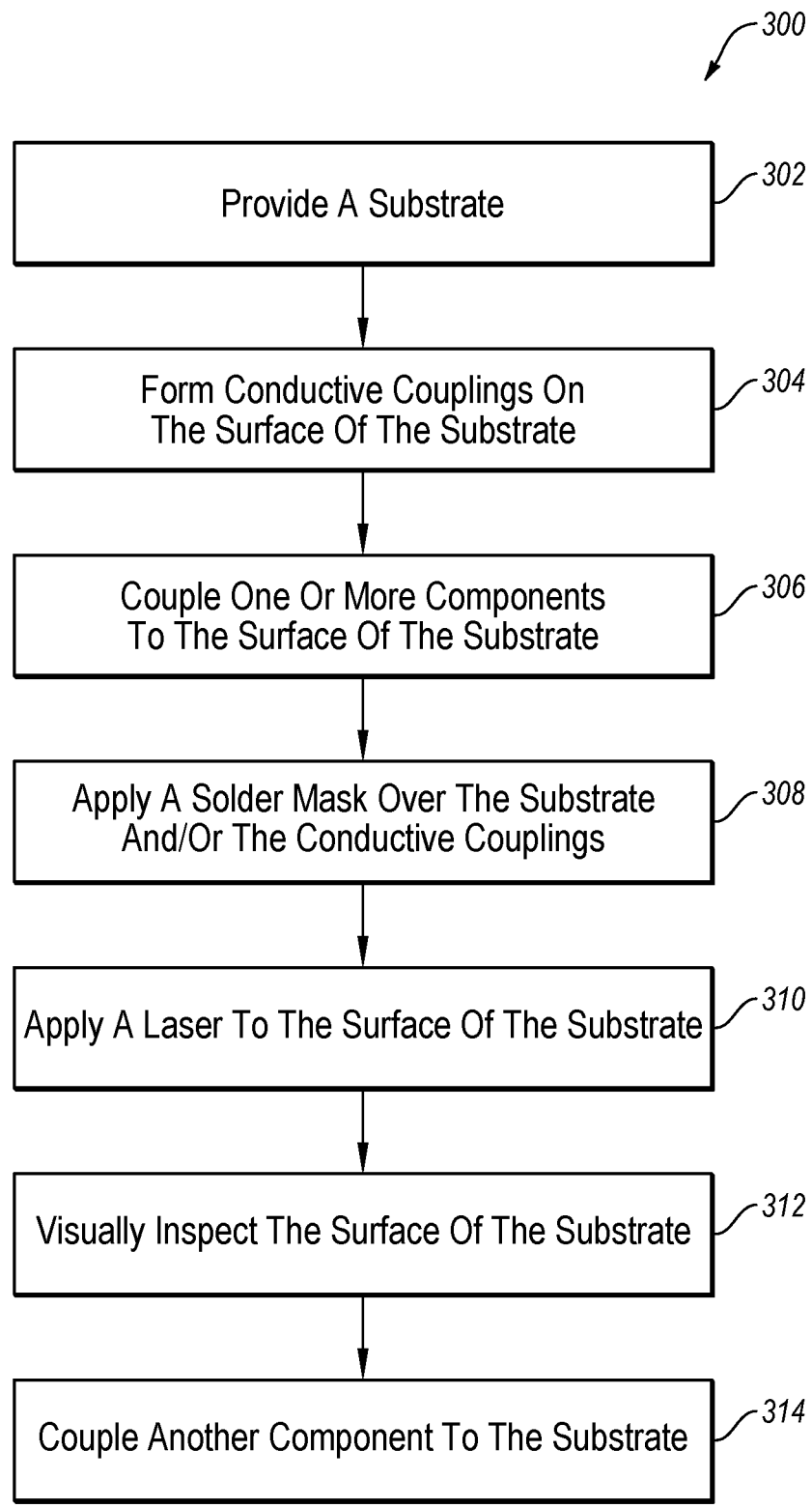
FIG. 3 is flow chart of an example method of forming a PCBA.

FIG. 3 is flow chart of an example method 300 of forming a PCBA and/or modifying a surface of a PCB. The method 300 may be implement in construction of an assembly that includes a PCB such as the PCBA 100 of FIGS. 1A-1B. Although illustrated as discrete blocks, various steps in FIG. 3 may be divided into additional steps, combined into fewer steps, or eliminated, depending on the desired implementation.

The method 300 may begin at step 302, in which a substrate may be provided. For example, the substrate 102 of FIGS. 1A-1B may be provided. At step 304, conductive couplings may be formed on a surface of the substrate. For instance, referring to FIGS. 1A-1B, the conductive couplings 106a-e may be formed on a surface of the substrate 102. Any suitable configuration may be used for forming the conductive couplings. For example, a layer of conductive material, such as copper, may be positioned over the substrate, which may be non-conductive. The conductive material may be etched or otherwise processed to remove a portion of the conductive material, and the remaining conductive material may form the conductive couplings on the surface of the substrate.

At step 306, one or more components may be coupled to the surface of the substrate. In some configurations, the components may be electrical components and/or optoelectronic components. For example, referring to FIGS. 1A-1B, the electrical components 104a-e and/or the optoelectronic components 108 may be coupled to the surface 118 of the substrate 102. Accordingly, at least one optoelectronic component may be coupled to a surface of the PCB. In some configurations, the components may be soldered to the conductive couplings of the PCB, thereby mechanically coupling the components to the PCB and electrically coupling the electrical components to the conductive traces.

At step 308, a solder mask may be applied over the substrate and/or the conductive couplings. The solder mask may be applied using any suitable technique. For example, in some configurations, the solder mask may be applied using a mask or silk screening technique. The solder mask may be applied as an epoxy liquid through a silkscreen pattern or mask onto the surface of the PCB (e.g., over the substrate and/or the conductive couplings). Additionally or alternatively, the solder mask may be applied using any suitable technique, such as liquid photoimageable solder mask (LPSM) or dry film photoimageable solder mask (DFSM). Once applied, the solder mask may be cured, for example, using a thermal or ultra violet curing process. Openings may be formed in the solder mask using any suitable process, such as photolithography. In some configurations, the solder mask may form the surface of the PCB, although in other configurations a solder mask may not be included in the PCB.

At step 310, a laser may be applied to the surface of the substrate or the PCB (e.g., lasering the surface). The laser may be applied to a certain area on the surface of the PCB. For example, the laser may applied on portions of the PCB where it may be desirable to remove or decompose contaminants. In another example, the laser may applied on portions of the PCB where it may be desirable to increase the roughness of the surface. In particular, the laser may be applied to a portion of the PCB where a component is to be coupled to the surface of the PCB. In some configurations, the component is to be coupled to the surface of the PCB may be an optical component. The area where the laser applied may be a laser-roughened area, such as the laser-roughened area 112, and the area where the component is coupled to the PCB may be a coupling area, such as the coupling area 110. As shown, for example, in FIGS. 1A-1C, the shape of the laser-roughened area may correspond to the shape of the coupling area, and in some configurations the laser-roughened area is smaller than the coupling area.

Application of the laser (e.g., lasering) may remove at least a portion of a layer of the PCB and/or may increase the roughness of the surface of the printed circuit board. In some aspects, the laser may increase the arithmetical mean deviation of the assessed profile of the surface of the printed circuit board by at least 0.1. Further, the laser may decompose or remove contaminants from the surface of the PCB. The laser may improve the coupling of the optical component to the printed circuit board by increasing the roughness of the surface of the printed circuit board and/or removing contaminants from the surface of the printed circuit board. In configurations where a solder mask is applied to the surface of the PCB, the laser may remove at least a portion of a solder mask on the PCB.

A characteristic of the laser such as the power, the intensity, and the wavelength of the laser may be selected to be sufficiently high to increase the roughness of the surface and/or remove contaminants without damaging the PCB and/or components coupled to the PCB. The desired power, intensity and wavelength of the laser may depend on materials included in the PCB (e.g., layers of the PCB), materials of the contaminants, materials of components coupled to the PCB, or any suitable combination thereof. In one example, the laser may be an ultraviolet laser, for example, a laser emitting electromagnetic radiation within a range of ultraviolet wavelengths. In some circumstances, ultraviolet wavelengths may include wavelengths between about 100 nanometers (nm) and about 400 nm. In some configurations, the laser may be about a 355 nm wavelength laser, although other suitable configurations may be implemented. Additionally or alternatively, in some configurations the laser may include a laser power of about 3 Watts (W).

Operation of the laser may be manually or automatically controlled using a controller. The controller may specify where on the substrate or the PCB the laser is applied. For example, the pattern that the laser is applied on the substrate or the PCB may correspond to the laser-roughened area 112 (see FIGS. 1A-1C). As such, the pattern may be selected such that the laser forms the laser-roughened area 112. In some configurations, it may be possible to accurately control the laser to form the laser-roughened area 112 in specific areas on the surface of the substrate or the PCB.

At step 312, the surface of the substrate or the PCB may be visually inspected. Application of the laser to the surface of the substrate or the PCB may visibly modify the surface in the area that the laser is applied. In particular, the laser may be applied for a sufficient time and duration to decompose a surface of the PCB such that the laser-roughened area (e.g., the laser-roughened area 112) is visually perceptible. Accordingly, it may be possible to determine whether a portion of the PCB has been lasered, whether contaminants have been removed from a certain area on the surface and whether the area has been roughened by visually inspecting the surface. For example, the laser may change the color or texture of the surface where the laser is applied. In particular, the color or texture of the surface may be different in the area because all or a portion of a layer may be removed by the laser. Such configurations may also facilitate positioning of components to be coupled to the surface because the visibly modified surface may indicate where the component should be attached to the surface.

Additionally or alternatively, visual inspection of the surface may facilitate in determining whether or not the laser was successfully applied to the surface, whether contaminants were removed in certain areas on the surface, and whether the surface was roughened in certain areas. In such configurations, components may be coupled to the surface in areas where contaminants have been removed and/or have been laser-roughened.

At step 314, another component may be coupled to the surface of the substrate or the PCB. The component may be coupled to the surface at the coupling area and/or the laser-roughened area formed by application of the laser. In some configurations, the component may be an optical component, such as lens, although the concepts described herein may be applied to other types of components as well. The component may be attached at a coupling area on the surface of the PCB, and the laser-roughened area may be positioned at least partially or fully inside of the coupling area. The component may be coupled to the surface in any suitable manner, and in some configurations an adhesive such as an epoxy may be used. In circumstances where the component is an optical component, the optical component may be optically aligned with one or more optoelectronic component coupled to the surface.

In some configurations, the optical component may at least partially enclose the optoelectronic component(s) after the optical component is coupled to the PCB. Additionally or alternatively, the optical component may hermetically seal the optoelectronic component(s) in between the PCB and the optical component. Accordingly, the optoelectronic component(s) may be hermetically sealed between the PCB and the optical component after the optical component is coupled to the PCB.

In some configurations, the method 300 may include attaching at least one electrical component to the surface of the substrate or the PCB, such as the electrical components 104*a-e* of FIGS. 1A-1B. In some configurations, the electrical component(s) may be coupled before the laser is applied, although in other embodiments the laser may be applied prior to or substantially concurrently with coupling the electrical components. The electrical component(s) may be electrically coupled by conductive couplings such as traces, tracks, pads and/or other features etched from one or more layers of electrically conductive material, such as copper. In some configurations, the electrical component(s) may be soldered to electrically and mechanically couple them to the substrate or the PCB.

One skilled in the art will appreciate that, for this and other procedures and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the disclosed embodiments.

Figure 4:
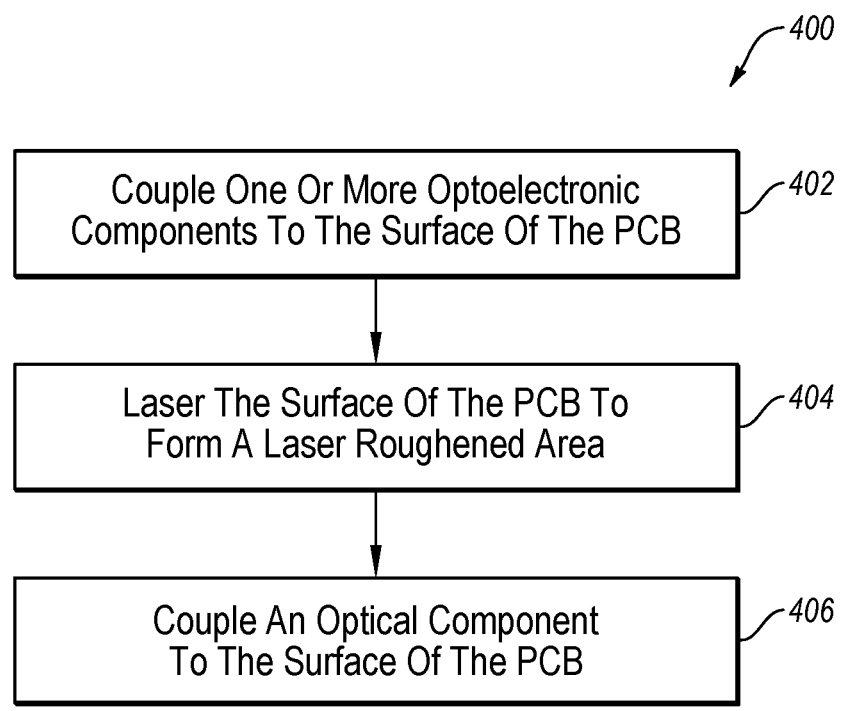
FIG. 4 is flow chart of another example method of forming a PCBA.

FIG. 4 is flow chart of an example method 400 of forming a PCBA and/or modifying a surface of the PCB, such as the PCBA 100 of FIGS. 1A-1B. The method 400 may include any suitable aspects of the method 300, or vice versa. Although illustrated as discrete blocks, various steps in FIG. 4 may be divided into additional steps, combined into fewer steps, or eliminated, depending on the desired implementation.

The method 400 may begin at step 402, in which one or more optoelectronic components may be coupled to the surface of the PCB. For instance, the optoelectronic components 108 of FIGS. 1A-1B may be coupled to the surface of the PCB. Accordingly, at least one optoelectronic component may be coupled to a surface of the PCB. In some configurations, the optoelectronic component may be soldered to the conductive couplings of the PCB, thereby mechanically coupling the optoelectronic to the PCB and electrically coupling the electrical components to the conductive traces.

At step 404, the surface of the PCB may be lasered to form a laser-roughened area on the surface of the PCB. The laser may be applied to a certain area on the surface of the PCB. For example, the laser may applied on portions of the PCB where it may be desirable to remove contaminants and/or increase the roughness of the surface. In particular, the laser may applied to a portion of the PCB where a component is to be coupled to the surface of the PCB. The area where the laser is applied may be a laser-roughened area, and the area where the component is coupled to the PCB may be a coupling area. The shape of the laser-roughened area may correspond to the shape of the coupling area. In some configurations, the laser-roughened area is smaller than the coupling area. The laser-roughened area may surround the optoelectronic components in a plane defined by the PCB.

The laser may remove at least a portion of a layer of the PCB and/or may increase the roughness of the surface of the PCB. In some aspects, the laser may increase the arithmetical mean deviation of the assessed profile of the surface of the PCB by at least 0.1. Further, the laser may remove contaminants from the surface of the PCB. The laser may improve the coupling of the optical component to the printed circuit board by increasing the roughness of the surface of the printed circuit board and/or removing removes contaminants from the surface of the printed circuit board. In some configurations, a solder mask may be applied over the PCB before the lasering. In such configurations, the laser may remove at least a portion of a solder mask on the PCB.

The power, intensity and/or wavelength of the laser may be selected to be sufficiently high to increase the roughness of the surface and/or remove contaminants without damaging the PCB and/or components coupled to the PCB. The desired power, intensity and/or wavelength of the laser may depend on materials included in the PCB (e.g., layers of the PCB), materials of the contaminants, materials of components coupled to the PCB, or any suitable combination thereof. In one example, the laser may be an ultraviolet laser, for example, a laser emitting electromagnetic radiation within a range of ultraviolet wavelengths. In some circumstances, ultraviolet wavelengths may include wavelengths between 100 nanometers (nm) and 400 nm. In some configurations, the laser may be a 355 nm wavelength laser, although other suitable configurations may be implemented. Additionally or alternatively, inn some configurations the laser may include a laser power of 3 Watts (W).

In some configurations, the surface of the substrate or the PCB may be visually inspected. Applying the laser to the surface of the substrate or the PCB may visibly modify the surface in the area that the laser is applied. In particular, the laser may be applied for a sufficient time and duration to decompose a surface of the PCB such that the laser-roughened area is visually perceptible. Accordingly, it may be possible to determine whether a portion of the printed circuit board has been lasered, whether contaminants have been removed from a certain area on the surface and/or whether the area has been roughened by visually inspecting the surface. For example, the laser may change the color or texture of the surface where the laser is applied. In particular, the color or texture of the surface may be different in an area because all or a portion of a layer may be removed by the laser. Such configurations may also facilitate positioning of components to be coupled to the surface, because the visibly modified surface may indicate where the component should be attached to the surface.

Additionally or alternatively, visual inspection of the surface may facilitate in determining whether or not the laser was successfully applied to the surface, whether contaminants were removed in certain areas on the surface, and/or whether the surface was roughened in certain areas. In such configurations, components may be coupled to the surface in areas where contaminants have been removed and/or have been laser-roughened.

At step 406, an optical component may be coupled to the surface of the PCB. The optical component may be coupled to the surface at the coupling area and/or the laser-roughened area formed by applying the laser. In some configurations, the optical component may be a lens, although the concepts described herein may be applied to other types of components. The optical component may be attached at a coupling area on the surface of the printed circuit board, and the laser-roughened area may be positioned at least partially or fully inside of the coupling area. The optical component may be coupled to the surface in any suitable manner, and in some configurations an adhesive may be used. In some circumstances, the optical component may be optically aligned with one or more optoelectronic component coupled to the surface.

Figure 5A:
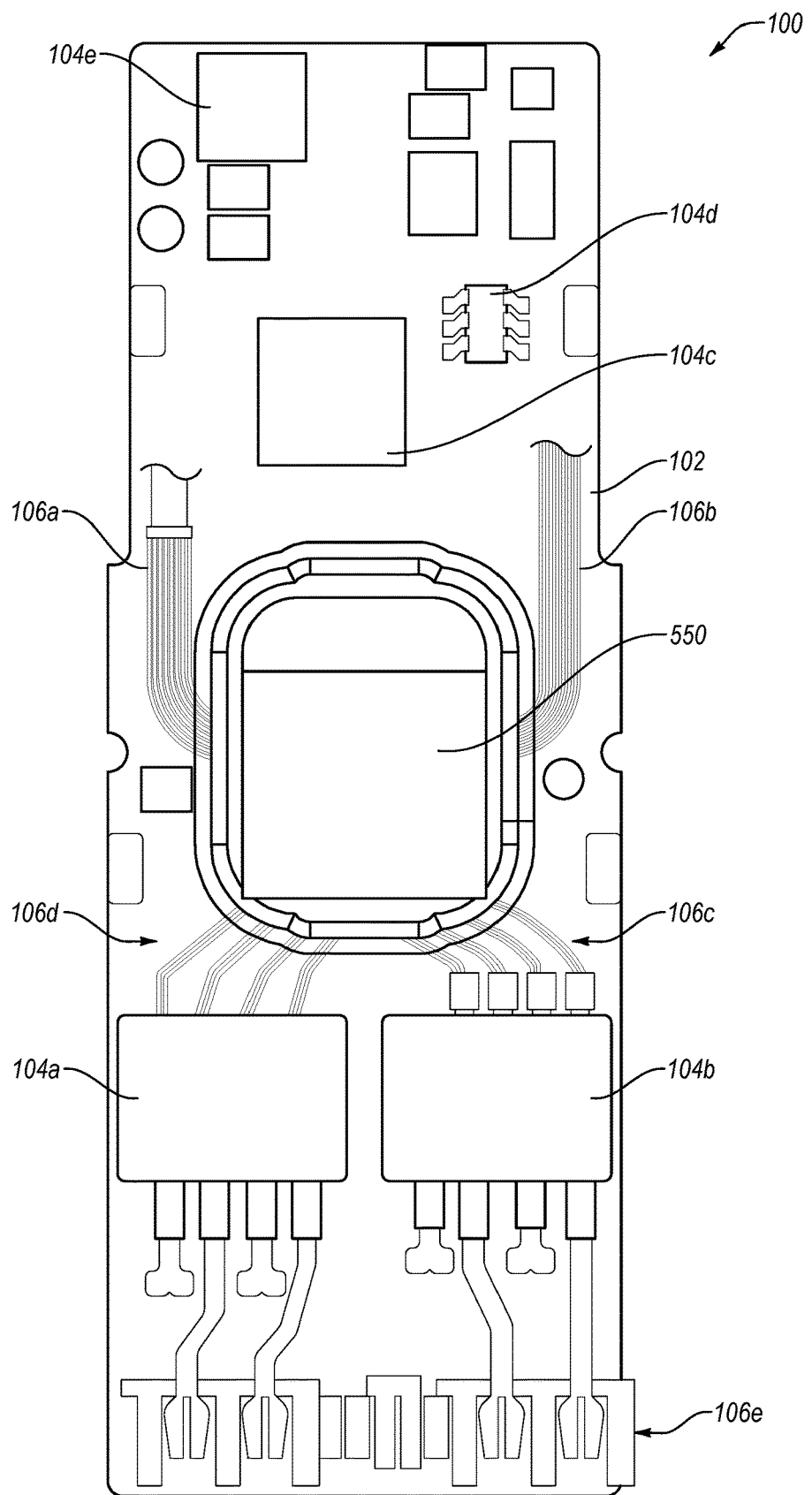
FIG. 5A is a top schematic view of the PCBA of FIG. 1A with an optical component.
Figure 5B:
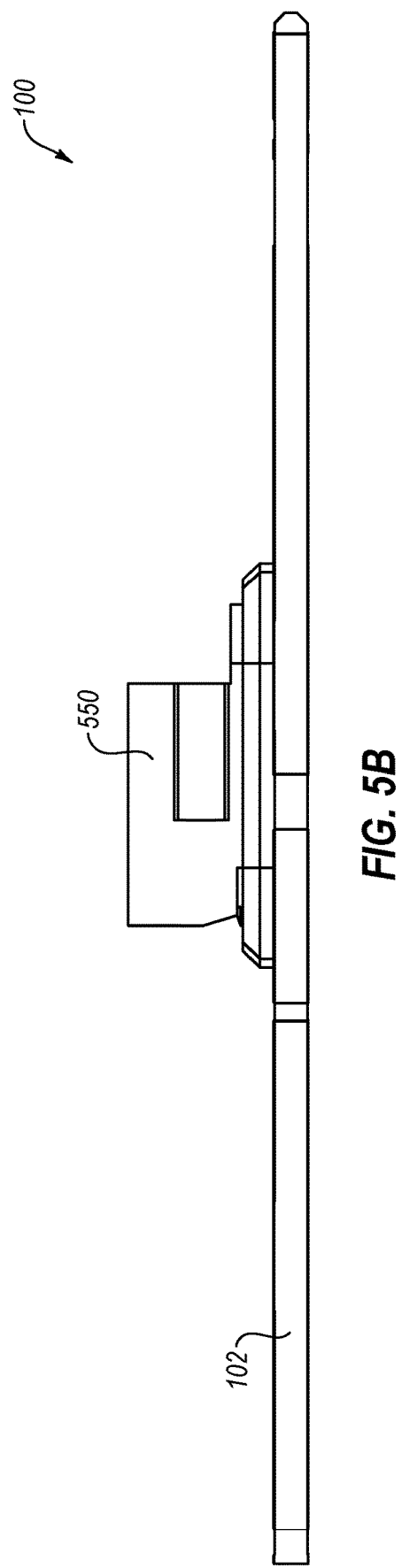
FIG. 5B is a side schematic view of the PCBA of FIG. 5A.

FIGS. 5A-5B illustrate an optical component 550 coupled to the surface of the PCBA 100. In particular, FIG. 5A is a top schematic view of the PCBA 100 with the optical component 550 and FIG. 5B is a side schematic view of the PCBA 100 with the optical component 550 coupled to surface. In some configurations, the optical component 550 may be coupled to the surface of the PCBA 100 at the coupling area 110 and/or the laser-roughened area 112 formed by applying the laser (see FIG. 1A). In some configurations, the optical component 550 may be a lens, although the concepts described herein may be applied to other types of components. The optical component 550 may be attached at a coupling area on the surface of the PCBA 100, and the laser-roughened area may be positioned at least partially or fully inside of the coupling area. The optical component 550 may be coupled to the surface in any suitable manner, and in some configurations an adhesive may be used. In some circumstances, the optical component 550 may be optically aligned with one or more optoelectronic component coupled to the surface.

In some configurations, the optical component 550 may at least partially enclose optoelectronic components, such as the optoelectronic components 108 of FIG. 1A, after the optical component 550 is coupled to the PCBA 100. Additionally or alternatively, the optical component 550 may hermetically seal optoelectronic components in between the PCBA and the optical component 550. Accordingly, the optoelectronic components 108 of FIG. 1A may be hermetically sealed between the PCBA 100 and the optical component 550 after the optical component 550 is coupled to the PCBA 100. The optical component 550 may be a lens optically coupled or optically aligned to the optoelectronic components 108.

In some configurations, at least one electrical component may be attached to the surface of the PCB, such as the electrical components 104a-e of FIGS. 1A-1B. In some configurations, the electrical component(s) may be coupled before the laser is applied, although any suitable configuration may be implemented. The electrical component(s) may be electrically coupled by conductive couplings such as traces, tracks, pads and/or other features etched from one or more layers of electrically conductive material, such as copper. In some configurations, the electrical component(s) may be soldered to electrically and mechanically couple them to the substrate or the PCB.

In some circumstances, lasering the surface of the substrate or the PCB may be improve the bond between the component and the surface. In particular, the laser may improve the coupling of the optical component to the printed circuit board by increasing the roughness of the surface of the printed circuit board and/or removing contaminants from the surface of the printed circuit board. Such configurations may improve bonds when adhesives are used, buy may also be similarly advantageous in other bonding mechanisms. Furthermore, the configurations described herein may be used to avoid weak bonds, formed, for example, by contaminants and/or smooth surfaces of the substrate or PCB.

When the concepts described are implemented to bond optical components to the PCB, the resulting bond may robustly secure the optical component to the PCB. Furthermore, weak bonds may be avoided by removing any contaminants from the surface of the PCB where the optical component is bonded to the PCB. In such circumstances, the bond formed may be stronger and therefore may not break over time. The stronger bond may be useful during subsequent processing of the PCB to form the optoelectronic assembly, because the bond will not break during handling or subsequent processing. Additionally or alternatively, the stronger bond may not break after the optoelectronic assembly is manufactured, for example, during operation of the optoelectronic assembly. Such configurations may also prevent optoelectronic assemblies from failing prematurely because weak bonds caused by smooth surfaces or contaminants on the surface of the PCB may be avoided.

Although the described configurations may be particularly advantageous to bond optical components to PCBs, in other configurations the concepts described herein may be applied to improve bonding between any component and a PCB, for example, electrical components or any other component that may be bonded to a PCB.

The terms and words used in the description and claims are not limited to the bibliographical meanings, but, are merely used to enable a clear and consistent understanding of the disclosure. It is to be understood that the singular forms "a," "an," and "the" include plural referents unless the context clearly dictates otherwise. Thus, for example, reference to "a component surface" includes reference to one or more of such surfaces.

As used herein, an "electrical component" refers to a component that involves electricity, an "optical component" refers to a component that involves electromagnetic radiation (e.g., visible light or others), and an "optoelectronic component" refers to a component that involves both electrical signals and optical signals, and/or the conversion of electrical signals to optical signals, or vice versa.

By the term "substantially" it is meant that the recited characteristic, parameter, or value need not be achieved exactly, but that deviations or variations, including for example, tolerances, measurement error, measurement accuracy limitations and other factors known to those skilled in the art, may occur in amounts that do not preclude the effect the characteristic was intended to provide.

Aspects of the present disclosure may be embodied in other forms without departing from its spirit or essential characteristics. The described aspects are to be considered in all respects illustrative and not restrictive. The claimed subject matter is indicated by the appended claims rather than by the foregoing description. All changes which come within the meaning and range of equivalency of the claims are to be embraced within their scope.

What is claimed is:

1. A method of modifying a surface of a printed circuit board in an optoelectronic assembly, the method comprising:
   coupling at least one optoelectronic component to the surface of the printed circuit board;
   lasering the surface of the printed circuit board to form a laser-roughened area on the surface of the printed circuit board; and
   coupling an optical component to the printed circuit board at the laser-roughened area on the surface of the printed circuit board;
   wherein the laser-roughened area is positioned entirely within a coupling area defined by the optical component contacting the printed circuit board.

2. The method of claim 1, wherein the optical component is attached at a coupling area on the surface of the printed circuit board, and the laser-roughened area is positioned at least partially inside of the coupling area.

3. The method of claim 1, wherein the lasering removes at least a portion of a layer of the printed circuit board.

4. The method of claim 1, wherein the lasering increases the roughness of the surface of the printed circuit board at the laser-roughened area.

5. The method of claim 1, wherein the lasering increases the root-mean-squared roughness of the surface of the printed circuit board by at least 0.1 microns.

6. The method of claim 1, wherein the lasering removes contaminants from the surface of the printed circuit board.

7. The method of claim 1, wherein the lasering improves the coupling of the optical component to the printed circuit board by increasing the roughness of the surface of the printed circuit board and/or removing contaminants from the surface of the printed circuit board.

8. The method of claim 1, wherein the optical component is coupled to the printed circuit board using an adhesive.

9. The method of claim 1, further comprising applying a solder mask to the surface of the printed circuit board before the lasering, wherein the lasering removes at least a portion of the solder mask on the printed circuit board.

10. The method of claim 1, wherein the optical component is a lens optically coupled to the optoelectronic component, wherein the lens is optically aligned with the optoelectronic component.

11. The method of claim 1, wherein the laser-roughened area surrounds the optoelectronic component in a plane defined by the printed circuit board, and the optical component at least partially encloses the optoelectronic component after the optical component is coupled to the printed circuit board.

12. The method of claim 1, wherein the optoelectronic component is hermetically sealed between the printed circuit board and the optical component after the optical component is coupled to the printed circuit board.

13. The method of claim 1, further comprising attaching at least one electrical component to the surface of the printed circuit board.

14. The method of claim 1, wherein the laser is applied for a sufficient time and duration to decompose a surface of the PCB such that the laser-roughened area is visually perceptible, further comprising visually inspecting the surface of the printed circuit board to determine whether a portion of the printed circuit board has been lasered.

15. A method of modifying a surface of a printed circuit board in an optoelectronic assembly, the method comprising:
   coupling at least one electronic component to the surface of the printed circuit board;
   coupling at least one optoelectronic component to the surface of the printed circuit board;
   lasering the surface of the printed circuit board to form a laser-roughened area on the surface of the printed circuit board, wherein the electrical component is coupled to the surface of the printed circuit board before the lasering of the surface; and
   coupling an optical component to the printed circuit board at the laser-roughened area on the surface of the printed circuit board.

* * * * *